United States Patent [19]
Curtiss

[11] Patent Number: 4,467,262
[45] Date of Patent: * Aug. 21, 1984

[54] POLYPHASE MOTOR DRIVE SYSTEM WITH BALANCED MODULATION

[75] Inventor: William P. Curtiss, Winthrop, Mass.

[73] Assignee: The Charles Stark Draper Laboratory, Inc., Cambridge, Mass.

[*] Notice: The portion of the term of this patent subsequent to Dec. 15, 1998 has been disclaimed.

[21] Appl. No.: 330,655

[22] Filed: Dec. 14, 1981

Related U.S. Application Data

[63] Continuation of Ser. No. 133,531, Mar. 24, 1980, Pat. No. 4,306,182.

[51] Int. Cl.³ .............................................. H02P 5/40
[52] U.S. Cl. ..................................... 318/811; 318/807
[58] Field of Search ............................... 318/807-811, 318/803; 363/40-43

[56] References Cited
U.S. PATENT DOCUMENTS 4,267,499  5/1981  Kurosawa ........................... 318/807
4,272,715  6/1981  Matsumoto ......................... 318/807
4,361,794  11/1982  Kawada et al. ..................... 318/811

Primary Examiner—David Smith, Jr.
Attorney, Agent, or Firm—Lahive & Cockfield

[57] ABSTRACT

Sinusoidal excitation currents are supplied to the three terminals of a "wye" or "delta" connected three phase motor by an improved multiphase motor energizing drive system. For each terminal associated with a different phase, an individual feedback signal representing the current flowing into that respective terminal is sensed and subtracted from its corresponding controllable sine wave reference command to produce a current error signal for each terminal. The error signal for each of these currents is preferably converted to a two-state signal by means of an associated pulse width modulator. The modulator outputs are used to control power semiconductor switches which connect the corresponding motor terminal to either the positive or negative dc voltage. In the preferred system, for one of the terminals, the associated current feedback loop and reference command are omitted, and the associated pulse width modulator is driven by the inverted sum of the error signals from the other two phases. The result is inherently balanced multiphase excitation currents into the motor terminals.

5 Claims, 7 Drawing Figures

POLYPHASE MOTOR DRIVE SYSTEM WITH BALANCED MODULATION

This is a continuation of application Ser. No. 133,531, filed Mar. 24, 1980, now U.S. Pat. No. 4,306,182.

BACKGROUND OF THE INVENTION

The invention relates generally to the field of polyphase motor excitation and control systems and particularly to systems for multistate modulation excitation of three terminal three phase motors.

In AC motors and brushless dc motors, fixed primary windings, usually called stator windings, are distributed about the axis of a rotor, which in turn is coupled to the motor shaft. Alternating currents of different phases of the same frequency are supplied to these stator windings to create a sinusoidally distributed rotating field in the machine air gap. Three phase motor construction and excitation is commonly used with the stator windings in either of two conventional configurations designated "wye" or "delta". The motor may be of the synchronous type wherein the rotor contains permanent magnets or separately electrified windings or the motor may be of the asynchronous type wherein the rotor is comprised of secondary conductors arranged in a shorted turn configuration, in which case the motor is referred to as an "induction" motor.

Historically, AC motors and particularly induction motors, have been relegated primarily to fixed speed applications. However, with advances in semiconductor switching technology, it has become feasible to provide reliable low cost alternating current sources of variable frequency and amplitude, thus providing an opportunity for enhanced control of the AC motor at varying speeds and loads. Prior art switching systems, discussed in more detail below, have been designed that create a pulse waveform which approximates a sinusoidal waveform across each motor terminal pair.

For applications with tight requirements on ripple torques (especially at low speed), the currents in the stator windings must be kept very sinusoidal. High efficiency polyphase switching systems employed to create sinusoidal currents ordinarily use some form of pulse width modulation. In the prior art, these systems broke into two classes: one based on current excitation and the other on voltage excitation. The current excitation class involved what is commonly referred to as the current mode inverter technology. A single controlled "link" current was electronically rapidly "reconnected", for varying time intervals, to a different pair of motor terminals so as to create balanced pulse-width modulated current signals into each terminal. Although the harmonic current energy was high in these systems, its spectrum could be controlled to achieve adequate performance in systems with modest ripple torque specifications.

The other multiphase prior art systems which attempted to satisfy balanced sinusoidal current requirements, utilized a dc voltage link with individual two state modulators, typically pulsewidth modulators, creating balanced but variable voltage excitation to the motor terminals. In this configuration, current feedback was conventionally incorporated by sensing an appropriate common current measure, for example, the multiphase full wave rectified terminal currents. The current error signal from a dc reference would then simultaneously modify the amplitudes of all three modulators.

Direct measurement of an individual modulator's instantaneous output current (terminal current) with individual feedback to control that modulator's command has many potential advantages such as high bandwidth, precise phase and amplitude control and is the dominant technique used in high performance two phase motor controller designs (principally brushless dc motors). These two phase motors were driven either from a single dc supply utilizing four motor terminals or from a dual supply (three terminals) with positive and negative supply voltages and a common ground. Application of prior art individual terminal direct current feedback techniques to n phase, n terminal motors ($n \geq 3$) from a single dc supply presents problems due to the Kirchoff current constraint to which no optimum solution exists in the prior art.

SUMMARY OF THE INVENTION

Accordingly, one of the general objects of the invention is to produce variable amplitude variable frequency balanced sinusoidal excitation currents for a polyphase motor. Another object of the invention is to simplify and perfect three phase pulse modulation excitation systems for AC motors generally and particularly for induction motors. Another object of the invention is to provide a polyphase AC motor with balanced sinusoidal excitation current to substantially eliminate ripple torques in variable speed, variable torque applications, such as elevators and traction vehicles. A still further object is to create a linear torque loop based on such balanced sinusoidal excitation in an induction motor.

It has been discovered that balanced excitation currents can be readily supplied to an n terminal n phase motor from a single dc supply by taking into account certain Kirchoff constraints on the multiterminal motor network. For $n-1$ of the terminals, the separate terminal currents are directly sensed to generate $(n-1)$ feedback signals which are subtracted from their respective controllable sine wave reference commands to produce $(n-1)$ current error signals. The current error signals for each of these directly sensed terminals are respectively converted by identical modulators to two-state or multi-state signals, preferably, if two state, by means of pulse width modulators. The modulator outputs are used to control semiconductor switches which connect the corresponding motor terminal to the proper voltage level. It is also noted that the modulators can be any device which creates a dc component of voltage (vline-to-neutral) which is proportional to the amplitude of the error signal. Indeed, multistate modulators, e.g., 2, 3, 4, ... or even linear amplifiers could be substituted for the preferred two state embodiment. If two state, these levels would correspond to the positive or negative terminals of a single two terminal dc supply. The drive for the remaining nth terminal may be provided in the same manner; however, it is more advantageous to omit the nth feedback loop and drive the associated nth modulator with the inverted sum of the $(n-1)$ other current error signals. Thus, in a three terminal, three phase motor, the currents flowing into two terminals are directly controlled while the voltage into the third terminal is controlled as a function of the current error signals from the other two terminals.

In a preferred two state embodiment, a conventional pulse width modulator is utilized wherein the input error signal is compared with a common high frequency triangular waveform reference signal and the polarity of the result is used to generate corresponding high or low output level commands. The resulting pulse width modulated signal is used to control a corresponding pair of complementary semiconductor switches connected in series between the dc supply terminals, the corresponding motor terminal being connected to the junction between the switches. The use of a common triangular reference provides significant ripple cancellation. Synchronization of the fundamental triangular reference frequency at high input frequencies to an integral multiple (preferably ×9) of the input frequency (i.e., the commanded stator excitation frequency), helps to further reduce torque ripple, while keeping the switching frequency at the lowest most efficient value possible.

DETAILED DESCRIPTION

Figure 1:
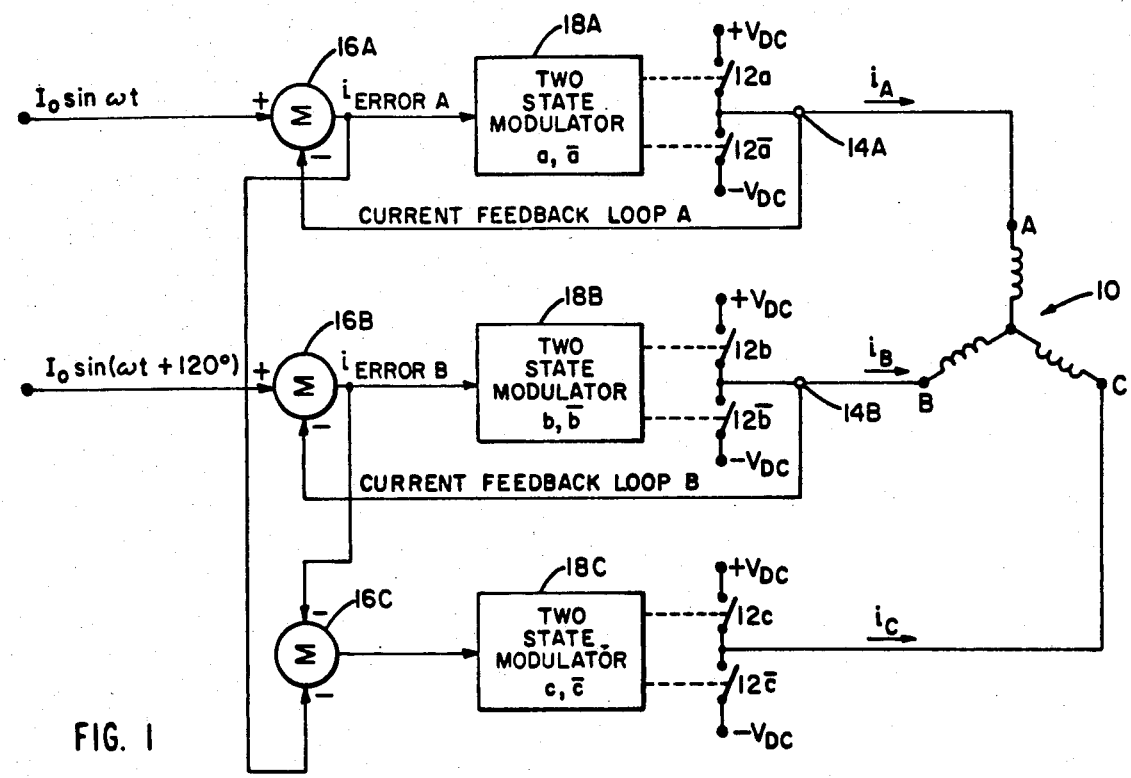
FIG. 1 is a block diagram of a preferred balanced two state modulation excitation system for a three terminal, three phase motor, according to the invention.

A balanced excitation system for a three terminal three phase motor according to the invention is shown in FIG. 1. The stator windings 10 are interconnected in the conventional "wye" configuration. The outer end of the individual windings are connected to respective motor terminals A, B and C. Each motor terminal is connected to the junction between a pair of complementarily driven power semiconductor switches which connect the terminal to the positive or negative terminal of a two terminal dc supply. The individual semiconductor switches may be transistors with antiparallel diodes, SCR's with antiparallel diodes or bilateral power FET devices. To prevent current shoot through phenomena, the active semiconductors are operated in a break-before-make manner. The complementary switches are designated as 12a and 12$\bar{a}$, 12b and 12$\bar{b}$ and 12c and 12$\bar{c}$ wherein the bar notation illustrates the complementary nature of the switch control. The complementary nature results in a motor terminal always being connected to either a positive or negative supply terminal.

The instantaneous electrical current $i_A$ flowing into terminal A (and out through the other terminals B and C) is monitored by a current sensor 14A, fed back and subtracted in analog summing curcuit 16A from a sinusoidal input command $I_o$ sin $\omega t$. $I_o$ represents the commanded stator current amplitude and $\omega$ represents the commanded stator excitation frequency. Desired stator current amplitude and frequency are identical for all three phases. The desired phase relationship is 0°, 120° and 240°. For the first phase, phase A, the phase term in the input command is defined as 0°. The instantaneous current difference or error signal, $i_{ERROR\ A} = I_o$ sin $\omega t - i_A$, provided by circuit 16A is used to control a two state modulator 18A, which in effect converts the analog current error signal to a two state (binary) signal. This is accomplished preferably by pulse width modulation through which the varying amplitude content of the current error signal is synthesized by varying the duty cycle of the output such that its average value is proportional to the error signal. The output of the modulator 18A operates the semiconductor voltage switches 12a and 12$\bar{a}$. When the output of the modulator 18A is high, terminal A is connected to positive dc voltage. When the output of the modulator 18A is low, terminal A is connected to negative dc voltage.

While the voltage applied to the terminal A is either of two fixed levels, the reactance of the stator windings in combination with harmonic cancellation from the other phases smooths the current into an approximately sinusoidal waveform. It is this waveform which is directly sensed by sensor 14A and compared to the input command in the current feedback loop A to drive the modulator 18A. The effect of the feedback loop is to force the waveform and amplitude of the current flowing into terminal A to approach the commanded current excitation sinusoidal waveform. The more sinusoidal the stator currents, the lower the ripple torque.

The phase B terminal is driven by a similar network including switches 12b and 12$\bar{b}$, sensor 14B, summing circuit 16B and modulator 18B. With this configuration, terminal B is connected to the junction of dc supply switches 12b and 12$\bar{b}$ operated by modulator 18B. The current into terminal B is directly sensed by sensor 14B as in the phase A network. The current $i_B$ is subtracted from the input command for phase B, $I_o$ sin $(\omega t + 120°)$, which differs only in phase from the command for phase A. Current feedback loop B operates similarly to loop A.

Figure 2:
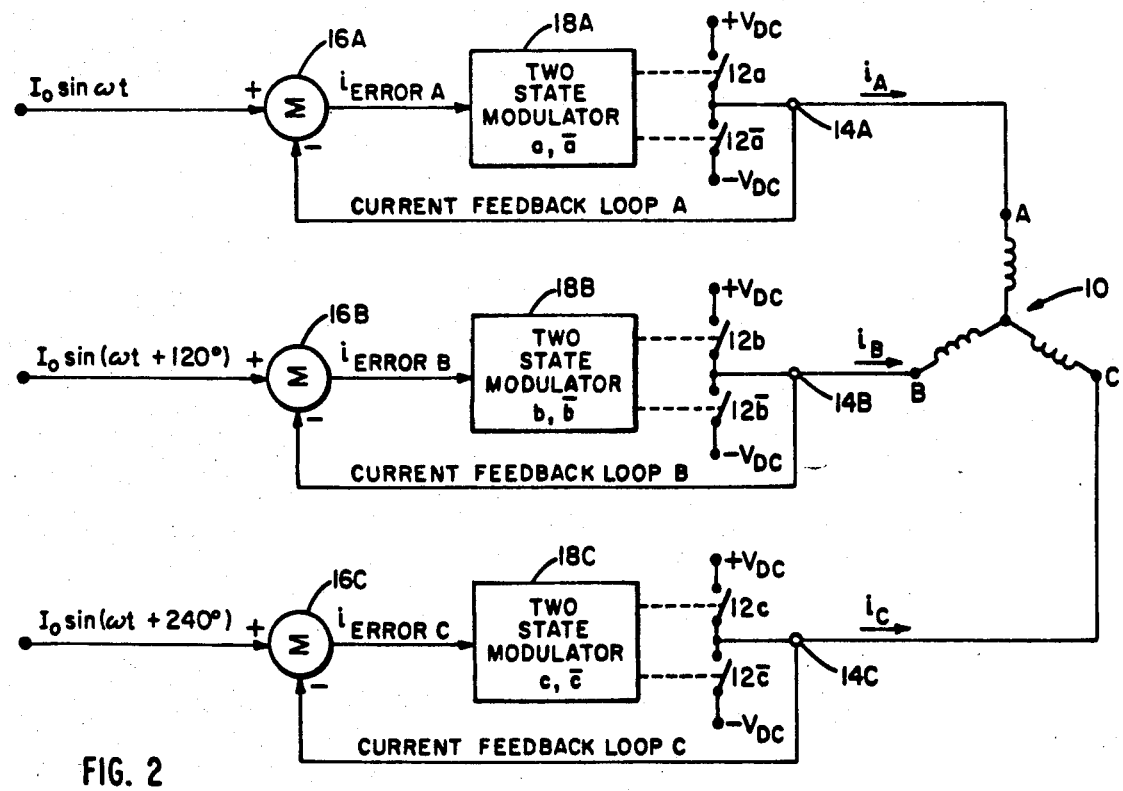
FIG. 2 is a block diagram of another two state modulation excitation system for a three terminal, three phase motor, according to the invention.

The phase C terminal may be driven in an analogous fashion by switches 12c and 12$\bar{c}$, sensor 14C, summing circuit 16C and modulator 18C, as shown in the system of FIG. 2. However, due to the Kirchoff current constraint, it is more advantageous to omit the current feedback loop C and reference command $I_o$ sin $(\omega t + 240°)$ altogether. As shown in the preferred system of FIG. 1, an analog summing circuit 16C' creates the negative sum of the current error signals for phases A and B which automatically provides the correct command for modulator 18C and produces an inherently balanced excitation system.

The input commands for loops A and B in FIG. 1 when compared to their respective outputs by the summing circuits 16A and 16B, create the following error signals:

$$i_{ERROR\ A} = I_o \sin \omega t - i_A$$

$$i_{ERROR\ B} = I_o \sin (\omega t + 120°) - i_B$$

The sum of the foregoing equations is:

$$i_{ERROR\ A} + i_{ERROR\ B} = I_o \sin \omega t + I_o \sin (\omega t + 120°) - (i_A + i_B).$$

The preceeding equation can be rewritten by applying both the trigonometric relationship $$I_o \sin \omega t + I_o \sin (\omega t + 120°) = -I_o \sin (\omega t + 240°)$$

and the Kirchoff constraint $i_C = -(i_A + i_B)$ to the right hand side. The resulting expression after multiplying both sides by ($-1$) becomes:

$$-(i_{ERROR\ A} + i_{ERROR\ B}) = I_o \sin(\omega t + 240°) - i_C.$$

It will be observed that the right-hand side of the immediately preceeding equation is identical to the expression for the desired input for modulator 18C if a separate reference input and feedback signal were utilized for this phase, as shown in FIG. 2. The fact that this idealized command is equal to the negative of the sum of the error signals thus eliminates the requirement for generation of the input current command signal for the third phase (and the sensing for this phase) as well as avoiding a delicate tolerancing and balancing requirement.

Figure 3:
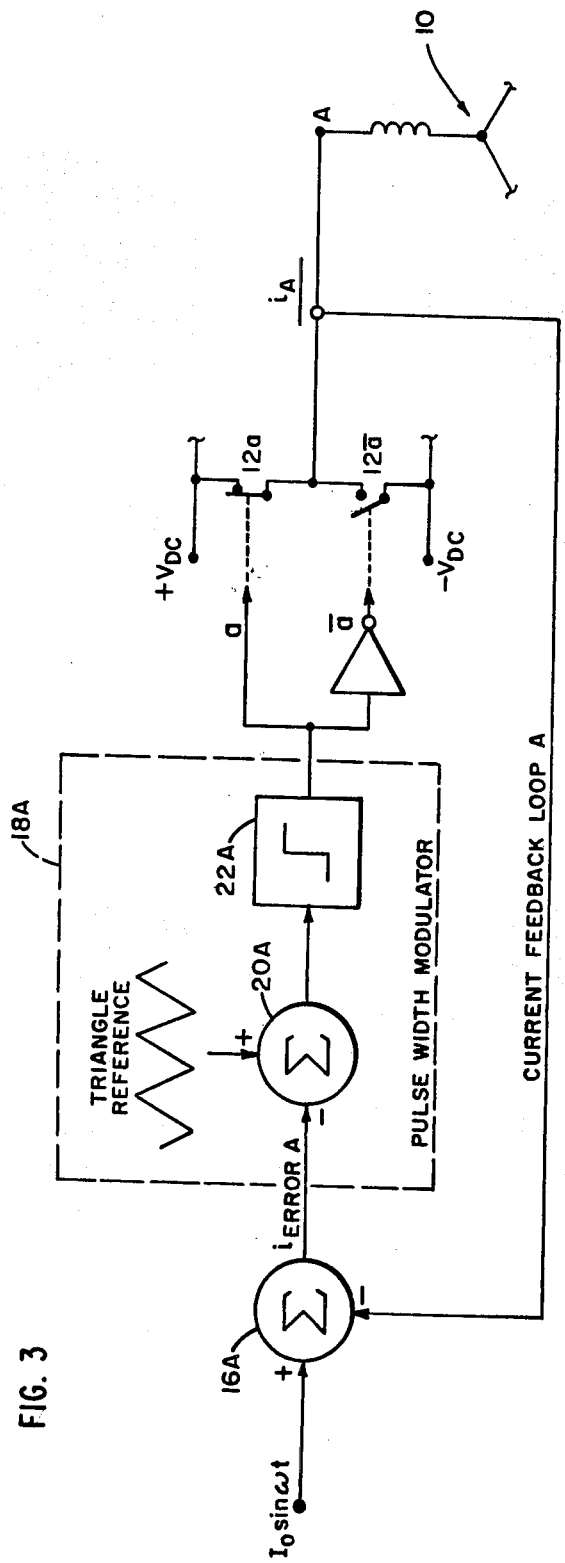
FIG. 3 is a block diagram illustrating a preferred two state modulator for the system of FIG. 1 or 2.

In the system of FIG. 1 or 2, the two state modulators 18A, 18B and 18C are identical pulse width modulators having the form shown in FIG. 3 for an isolated phase A. A triangle reference waveform symmetrical about zero at a frequency higher than the commanded frequency $\omega$, is compared to the current error signal by an analog summing circuit 20A. The output of the summing circuit is converted to a high or low fixed level by a zero crossing detector 22A. The detector 22A is responsive only to the polarity of the output of the summing circuit 20A. Consequently, the output of each pulse width modulator 18A, 18B or 18C is a series of width-modulated pulses corresponding in average value, cycle-by-cycle, to the error signal. Complementary pulse width modulated signals a and OVS/$\overline{a}$/ are used to operate semiconductor switches $12a$ and $12\overline{a}$ connected in series between the positive and negative supply voltage. The triangle reference should be precisely the same frequency and phase for all three modulators to fully exploit the ripple cancellation properties inherent in the three phase configuration. Synchronization of the triangle reference frequency to an integral multiple (preferably ×9) of the input (commanded stator excitation) frequency at high input frequencies also helps to reduce torque ripple while keeping the switching frequency at the lowest most efficient value possible.

Figure 4:
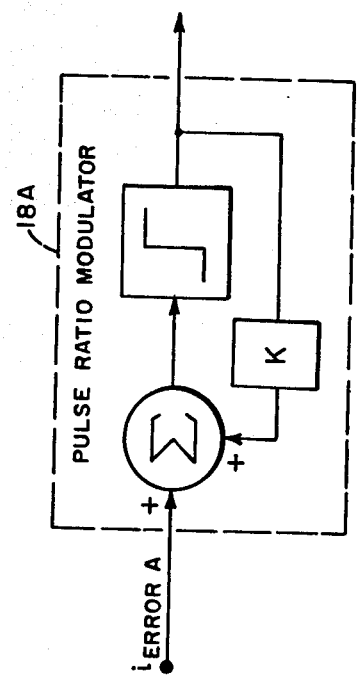
FIG. 4 is a block diagram illustrating another embodiment of the two state modulator of FIG. 1 or 2.

Alternatively, instead of pulse width modulators, the two state modulators 18A, 18B and 18C may be provided by respective pulse ratio (or hysteresis) modulators, as shown in FIG. 4 for phase A. In a pulse ratio modulator, the triangle reference waveform is replaced by a positive feedback hysteresis loop.

LINEAR TORQUE LOOP

Figure 5:
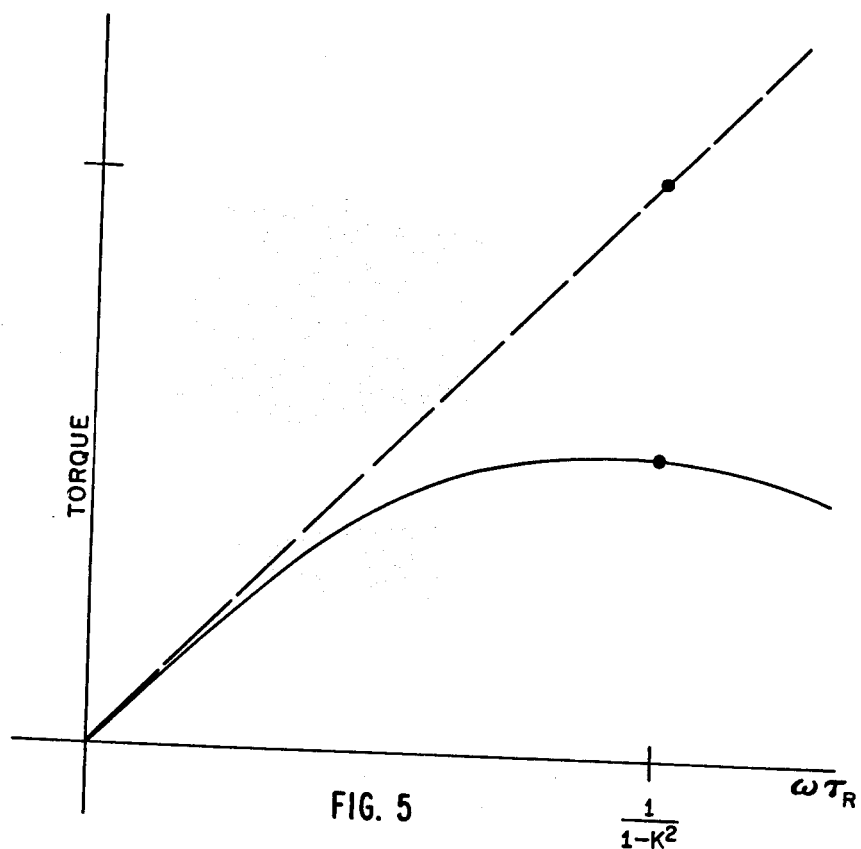
FIG. 5 is a graph illustrating the relationship between torque and the product of slip and the rotor time constant, at constant flux in an induction motor.

The multistate modulation excitation system of FIG. 1 or 2 can be advantageously employed, for example, in a control system for commanding slip frequency of an induction motor. If an induction motor is operated at a fixed flux level, torque (M) is given by the equation:

$$M = \frac{K^2 N^2 \Phi^2}{L} \left[ \frac{\omega T_R}{(1-K^2)^2 (\omega T_R)^2 + 1} \right] \quad \text{Eq. (1)}$$

where K represents the flux coupling coefficient from stator to rotor, typically greater than 0.95, N represents the number of stator turns, $\Phi$ represents the flux level in the air gap between the rotor and stator, L represents the stator inductance (a constant), $\omega$ represents the slip frequency and $T_R$ represents the rotor time constant which is the ratio of rotor inductance to rotor resistance. Equation 1 is quite linear with respect to $\omega$ as illustrated in FIG. 5 where torque is only fifty percent down from the linear asymptote (dashed line) even at the maximum torque point. If flux is selected to be near the flux saturation point, then the torque capacity of the motor is maximized.

Equation 1 implies that slip is commanded directly by the input and if flux is held constant, excellent linearity exists from zero up to typical nominal operating levels (one half maximum torque). This linearity is useful in servo applications.

The relationship between flux, stator current, and slip in an induction motor is given by the following equation:

$$\frac{\Phi}{\Phi_{SAT}} = \frac{I_s}{\frac{N\Phi_{SAT}}{L}} \left[ \frac{(1-K^2)^2 (\omega T_R^2 + 1)}{(\omega T_R)^2 + 1} \right]^{\frac{1}{2}} \quad \text{Eq. (2)}$$

where the new symbol $I_s$ represents stator current. The quantity $N\Phi_{SAT}/L$ has units of current and equals the peak magnitizing current at saturation. When the induction motor is operated at the flux level $\Phi_{SAT}$, then $I_s$ is uniquely specified by $\omega$.

$$I_s = \frac{N\Phi_{SAT}}{L} \left[ \frac{(\omega T_R)^2 + 1}{(1-K^2)^2 (\omega T_R)^2 + 1} \right]^{\frac{1}{2}} \quad \text{Eq. (3)}$$

Figure 6:
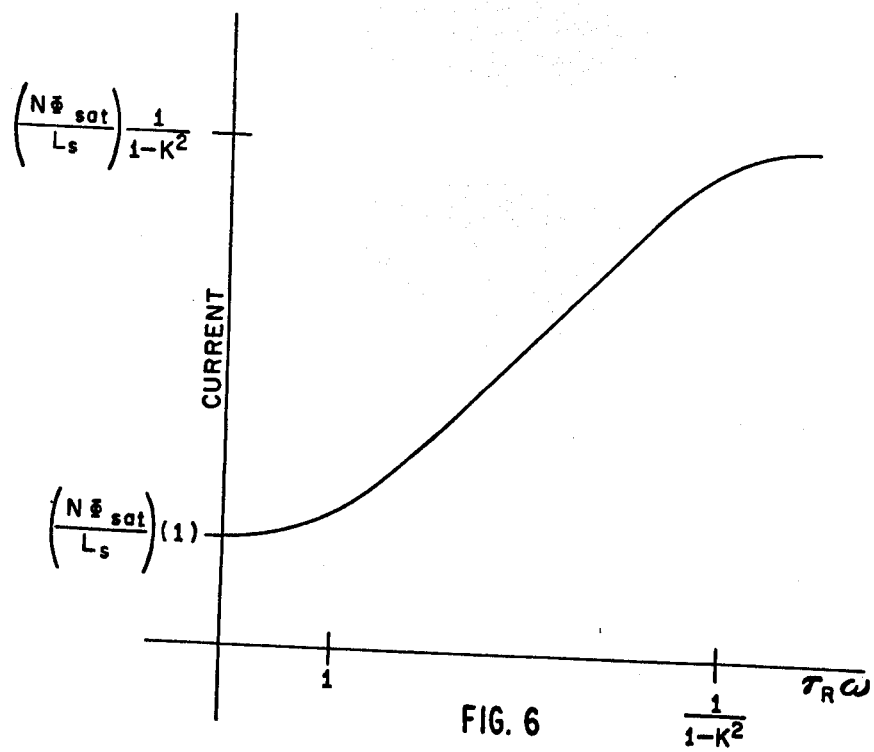
FIG. 6 is a graph illustrating the relationship between stator current and the product of slip and the rotor time constant, at constant flux in an induction motor.
Figure 7:
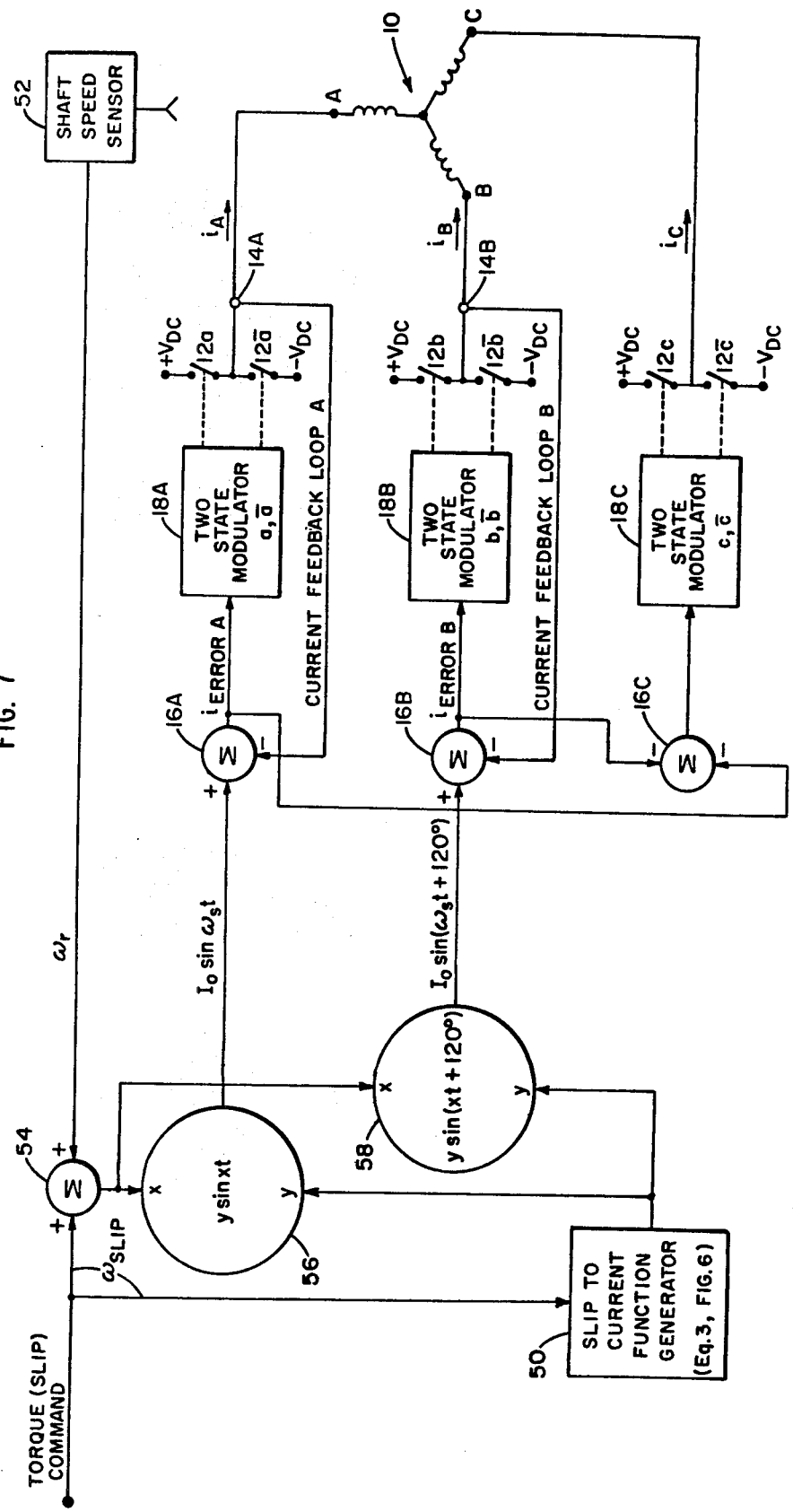
FIG. 7 is a block diagram of an induction motor controller employing the balanced two state modulation excitation system of FIG. 1 in a linear torque loop.

The relationship in Equation 3, graphed in FIG. 6, is utilized in a slip-to-current function generator 50 in FIG. 7 to convert a commanded value of slip frequency to a corresponding current command $I_o$ according to the relationship in Equation 3. Observing the slip-to-current relationship causes the flux to remain nominally constant which brings Equation 1 into play whereby torque is proportional to slip. The slip command itself is implemented by summing the output $\omega_r$ of a shaft speed sensor 52 (corrected for the number of pole pairs) with the commanded slip value in a summing circuit 54. The output of the summing circuit 54 forms the excitation frequency input $\omega_s$ to a pair of sine wave generators 56 and 58 which also receive the current command output $I_o$ from the function generator 50. The generators 56 and 58 produce respective current command signals at the amplitude commanded by the function generator 50 and the frequency commanded by the summing circuit 54. The phase difference between the two sine waves produced by the generators 56 and 58 is fixed at 120°. The outputs of the sine wave generators 56 and 58 thus form the two sine wave reference signals for loops A and B of the inherently balanced modulation excitation system in FIG. 7 which is otherwise identical to that shown in FIG. 1. Although less preferred, the linear torque loop of FIG. 7 could also be implemented with the system of FIG. 2, in which case a third sine wave generator at 240° would be required for feedback loop C. The torque command may be provided in the form of a voltage level from a potentiometer, for example. The resultant balanced three phase excitation of FIG. 7 produces the desired torque, and constant flux operation is automatically achieved by slewing the amplitude of stator current in accordance with Equation 3.

The system shown in FIG. 7 is applicable to a variety of induction motor control tanks which require linear torque command without resultant ripple torque. The symmetrical modulation properties inherent in the balanced modulation excitation system of FIG. 1 permit stator windings to be excited with approximately sinusoidal waveforms in a balanced manner with low harmonic noise. This system is particularly suitable for induction motor drives for variable speed variable torque applications, such as elevators and traction vehicles, which were formerly reserved for dc motors which are far more expensive to manufacture and maintain.

While it is believed that the multistate modulation excitation systems described herein (and particularly the inherently balanced system in FIG. 1) will find the most advantageous applications in the field of induction motors, the systems are applicable to synchronous motors or any three phase excitation system employing three reactive loads interconnected, for example, in either the "wye" or "delta" configuration. Moreover, while three phase systems are favored, any n phase n terminal drive system with a preferred phase separation of 360°/n, can be implemented using the principles of the excitation systems described herein. Likewise, while two state pulse width modulation is presently preferred, the invention will accommodate any multistate modulation scheme, including linear amplifier schemes (wherein the number of states is viewed as infinite so as to provide continuously variable voltage) as well as discrete voltage systems.

The foregoing description is intended to be illustrative rather than restrictive. The scope of the invention is indicated by the appended claims, and all variations and modifications coming within the range of equivalents thereto are intended to be embraced therein.

I claim:

1. A motor control system with balanced excitation for an n phase induction motor, where n is an integer, said motor having a rotor and a stator with n terminals, each of said terminals being associated with one of said phases, said control system including means responsive to a variable level of desired slip frequency and the sensed level of effective mechanical frequency of said rotor for generating a frequency control signal representative of desired stator excitation frequency, wherein the improvement comprises means for generating a current control signal representative of a desired stator current peak amplitude as a function of desired slip frequency, n switch networks, each of said switch networks including means for applying selected ones of a plurality of dc voltage levels to a respective one of said terminals in response to an applied switch control signal, sensing means for producing n feedback signals, each of said feedback signals being representative of the instantaneous current passing through a corresponding one of said terminals, means responsive to said frequency control signal and said current control signal for generating n command signals, each of said command signals being associated with one of said n terminals, and having identical frequency corresponding to said desired stator excitation frequency and identical peak amplitude corresponding to said desired stator current peak amplitude, and having the same phase relationship as that of the associated one of said n terminals, means for producing n error signals, each error signal being associated with one of said n terminals and being representative of the difference between the corresponding command signal and feedback signal for said associated terminal, n multistate modulation means for generating said switch control signals, wherein said n modulation means are responsive to the respective ones of said n error signals to generate n switch control signals and to apply said n switch control signals to the respective n switch networks.

2. The system of claim 1 wherein said current control signal generating means produces said current control signal approximately according to the formula:

$$I_s = \frac{N\Phi_{SAT}}{L_s}\left[\frac{(\omega T_R)^2 + 1}{(1 - K^2)^2 (\omega T_R)^2 + 1}\right]^{\frac{1}{2}}$$

where $I_s$ is said stator current peak amplitude, N represents the number of stator turns $\Phi_{SAT}$ represents a constant stator air gap flux level near saturation, K represents the flux coupling coefficient from stator to rotor, $L_s$ represents the stator inductance, w represents said desired slip frequency and TR is the rotor time constant.

3. The system of claim 1 wherein n is 3.

4. The system of claim 1 wherein said modulation means is a two state modulator.

5. The system of claim 4 wherein said two state modulator is a pulse width modulator.

* * * * *